United States Patent
Jung et al.

(10) Patent No.: US 6,309,925 B1
(45) Date of Patent: Oct. 30, 2001

(54) METHOD FOR MANUFACTURING CAPACITOR

(75) Inventors: Tz-Guei Jung, Hsinchu; Chia-Hsin Hou, Hsinchu Hsien; Joe Ko, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/643,211

(22) Filed: Aug. 22, 2000

(51) Int. Cl.[7] .................................................. H01L 21/8242
(52) U.S. Cl. ............................ 438/250; 438/649; 438/393
(58) Field of Search .................................... 438/3, 250–256, 438/381, 238–240, 393–399, 649

(56) References Cited

U.S. PATENT DOCUMENTS

| | | | |
|---|---|---|---|
| 5,393,691 | * | 2/1995 | Hsu et al. |
| 5,866,451 | * | 2/1999 | Yoo et al. ............................ 438/241 |
| 6,054,359 | * | 4/2000 | Tsui ...................................... 438/385 |
| 6,075,266 | * | 6/2000 | Yoshitomi ............................. 257/306 |

* cited by examiner

Primary Examiner—Jey Tsai
(74) Attorney, Agent, or Firm—Thomas, Kayden, Horstmeyer & Risley

(57) ABSTRACT

A method for manufacturing a capacitor. A semiconductor substrate is divided into a peripheral circuit region and a memory cell region. An isolation structure is formed in the memory cell region. A gate oxide layer is formed over the substrate outside the isolation structure. A polysilicon layer is formed over the gate oxide layer and the isolation structure. The polysilicon layer and the gate oxide layer are patterned to form a bottom electrode above the isolation structure. In the meantime a polysilicon gate electrode is also formed above the peripheral circuit region. Spacers are formed on the sidewalls of the polysilicon gate electrode and the bottom electrode. A metal silicide layer is formed over the bottom electrode and the polysilicon gate electrode. A dielectric layer is formed over the metal silicide layer above the bottom electrode. A metallic layer is formed over the dielectric layer to form a capacitor.

12 Claims, 2 Drawing Sheets

METHOD FOR MANUFACTURING CAPACITOR

BACKGROUND OF THE INVENTION

1. Field of the Invention

The present invention relates to a semiconductor device. More particularly, the present invention relates to a method for manufacturing a capacitor.

2. Description of the Related Art

Most capacitors that are formed in conjunction with other semiconductor devices have a pair of polysilicon electrodes. However, the polysilicon electrodes have some drawbacks including the formation of a depletion region whose thickness may vary. A variable thickness often leads to a variation of capacitance and a degradation of device performance. In the current state of technology, variation in depletion layer thickness often results in an even greater variation in capacitance because the inter-electrode dielectric layer has become thinner due to miniaturization.

FIGS. 1A through 1C are schematic cross-sectional views showing the progression of manufacturing steps for producing a conventional polysilicon electrode capacitor. Since a transistor is also formed in the peripheral circuit region at the same time, the steps for forming the transistor in the peripheral circuit region are also shown in FIGS. 1A through 1C.

As shown in FIG. 1A, a semiconductor substrate 100 having a memory cell region 100a and a peripheral circuit region 100b is provided. The memory cell region 100a has a field isolation structure 102 already formed in the substrate 100. Using chemical vapor deposition and conventional photolithographic techniques, a bottom polysilicon electrode 104 is formed over the field isolation structure 102. Chemical vapor deposition is conducted again to form a dielectric layer 106 over the bottom polysilicon electrode 104.

As shown in FIG. 1B, a thermal oxidation is carried out to form a gate oxide layer 110 over the substrate 100 in the peripheral circuit region 100b. A chemical vapor deposition is next carried out to form a polysilicon layer (not shown in the figure) over the entire silicon substrate 100. The polysilicon layer is patterned to form a top polysilicon electrode 108a above the bottom polysilicon electrode 104 and a polysilicon gate electrode 108b in the peripheral circuit region 100b.

As shown in FIG. 1C, conventional processing steps needed to complete the manufacture of source/drain terminals 114 and spacers 112 on the sidewalls of the gate electrode in the peripheral circuit region 100b are carried out.

In general, the polysilicon electrodes of a capacitor are doped (for example, using arsenic or phosphorus ions) to increase electrical conductivity. However, when a voltage is applied to the capacitor, electric charges are induced at the junction between the electrode and the inter-electrode dielectric layer. The electric charges near the junction cancel most of the effect of produced by the ionic dopants, thereby creating a depletion region.

The depletion region can be regarded as an extension of the inter-electrode dielectric layer. The presence of the depletion region, therefore, increases the effective dielectric layer of the capacitor. In general, the charge storage capacity of a capacitor is inversely proportional to the thickness of the inter-electrode dielectric layer. In other words, a capacitor having a thin dielectric layer is able to store a greater number of charges. However, the formation of a depletion layer increases the thickness of the dielectric layer, and hence reduces the capacitance of the capacitor. In addition, thickness of the depletion layer varies according to the voltage V applied to the electrodes. This can lead to a variation of the voltage coefficient $(1/C(dC/dV))$ of a capacitor and hence a de-stabilization of the device. Furthermore, polysilicon has a higher resistivity than other metallic materials. Therefore, polysilicon electrodes often limit the ultimate operating speed and performance of the capacitor.

SUMMARY OF THE INVENTION

The invention provides a method for manufacturing a capacitor. A semiconductor substrate divided into a peripheral circuit region and a memory cell region is provided. An isolation structure is formed in the memory cell region. A gate oxide layer is formed over the substrate outside the isolation structure. A polysilicon layer is formed over the gate oxide layer and the isolation structure. The polysilicon layer and the gate oxide layer are patterned to form a bottom electrode above the isolation structure. In the meantime, a polysilicon gate electrode is also formed above the peripheral circuit region. Spacers are formed on the sidewalls of both the polysilicon gate electrode and the bottom electrode. A metal silicide layer is formed over the bottom electrode and the polysilicon gate electrode. A dielectric layer is formed over the metal silicide layer above the bottom electrode, and a metallic layer is formed over the dielectric layer to form a capacitor.

In the present invention, the bottom electrode of the capacitor is a metal silicide layer while the top electrode is a metallic layer. Since depletion regions are unable to form in a metal or the metal silicide electrode and the resistivity of metal or metal silicide electrodes is smaller than a conventional polysilicon electrode, operating speed and frequency of the capacitor can be increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
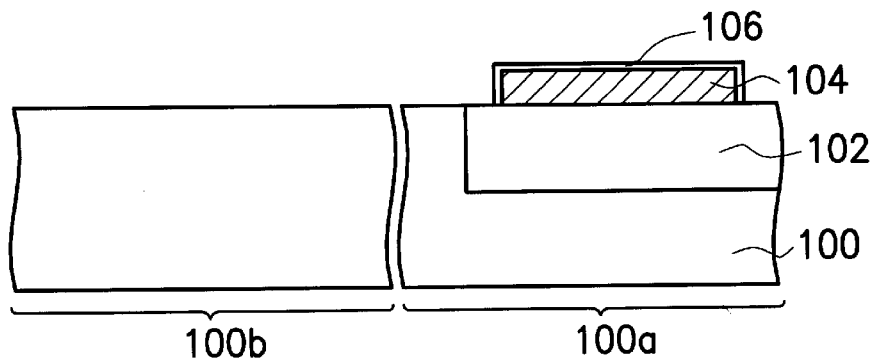
FIGS. 1A through 1C are schematic cross-sectional views showing the progression of manufacturing steps for producing a conventional polysilicon electrode capacitor.
Figure 1B:
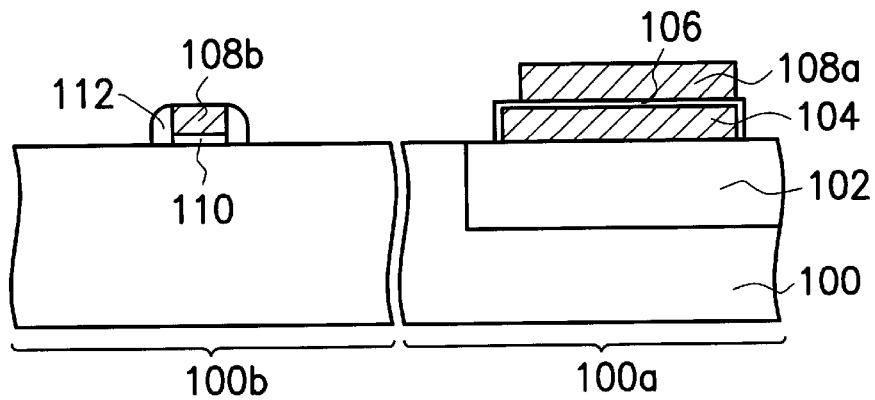
Figure 1C:
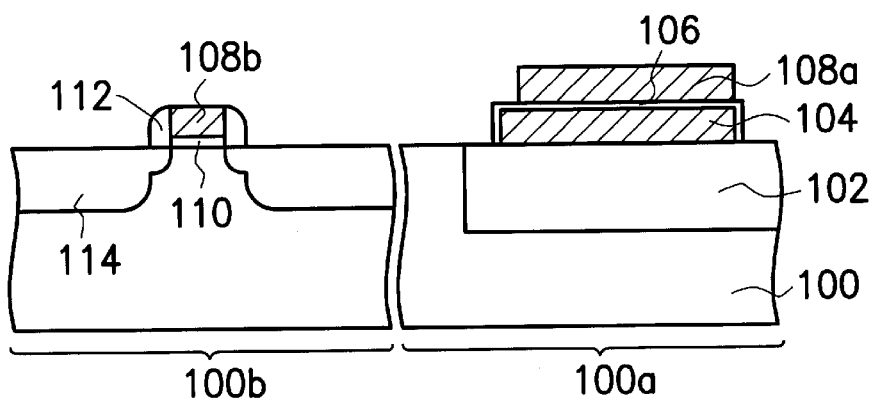

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic cross-sectional views showing the progression of manufacturing steps for producing a capacitor according to one preferred embodiment of this invention. Since a transistor is also formed in the peripheral circuit region at the same time, the steps for forming the transistor in the peripheral circuit region is also shown in FIGS. 2A through 2D.

Figure 2A:
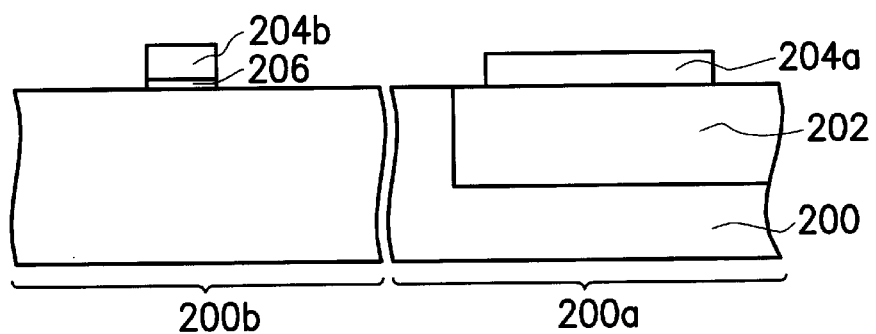
FIGS. 2A through 2D are schematic cross-sectional views showing the progression of manufacturing steps for producing a capacitor according to one preferred embodiment of this invention.

As shown in FIG. 2A, a semiconductor substrate 200 divided into a memory cell region 200a and a peripheral circuit region 200b is provided. The memory cell region 200a has a field isolation structure 202 such as a field oxide layer or a shallow trench isolation (STI) structure therein. A bottom polysilicon electrode 204a is formed over the isolation structure 202 while a polysilicon gate layer 204b is formed in the peripheral circuit region 200b. In general, an oxide layer 206 that serves as a gate oxide layer is formed prior to the formation of the polysilicon gate layer 204b.

The bottom polysilicon electrode 204a and the polysilicon gate layer 204b are usually formed in the same processing step. Typically, the polysilicon layers 204a and 204b are formed by chemical vapor deposition to deposit a layer of polysilicon (not shown in the figure) over the entire substrate 200. Conventional photolithographic and etching processes are next carried out to pattern the polysilicon layer. Hence, the bottom polysilicon electrode 204a above the isolation structure 202 and the polysilicon gate layer 204b in the peripheral circuit region 200b are formed at the same time. In addition, ions are frequently implanted into the polysilicon layer to increase electrical conductivity.

Figure 2B:
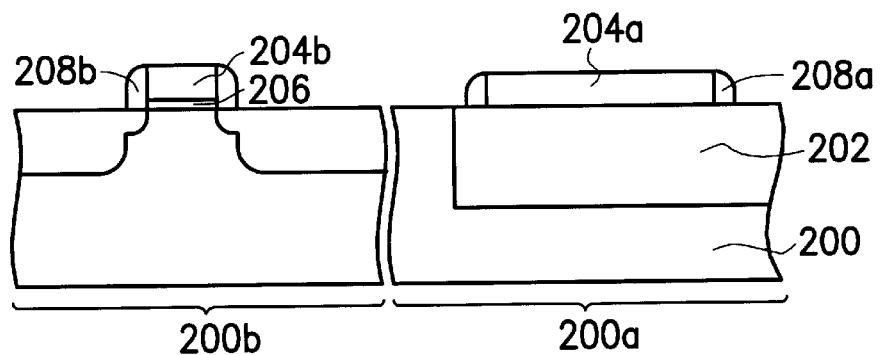

As shown in FIG. 2B, spacers 208b and 208a are formed on the sidewalls of the polysilicon gate electrode 204b and gate oxide layer 206 and the bottom polysilicon electrode 204a, respectively. The spacers 208b and 208a can be formed by, for example, performing chemical vapor deposition to form an oxide layer over the bottom electrode 204a and the polysilicon gate 204b. The oxide layer is etched back to form the spacers 208b and 208a by performing an anisotropic etching operation. Meanwhile, other processing steps related to the formation of a transistor in the peripheral circuit region 200b, for example, the source/drain regions, are also carried out. Since these operations are not directly related to this invention, detailed description is omitted here.

Figure 2C:
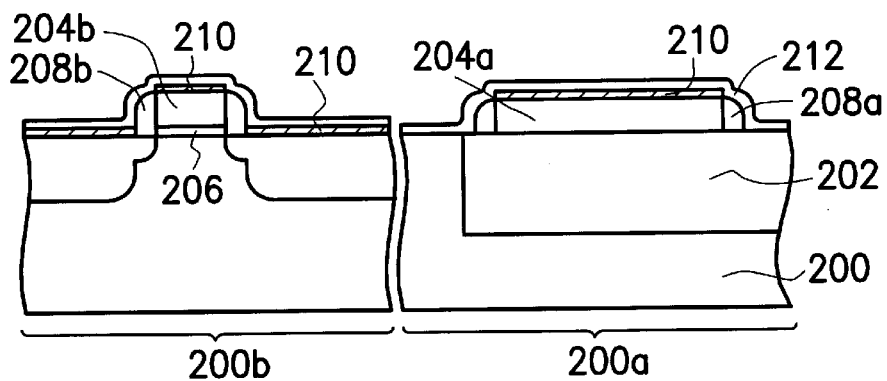

As shown in FIG. 2C, a metal silicide layer 210 is formed over the bottom polysilicon electrode 204a and the polysilicon gate electrode 204b. The method of forming the metal silicide layer 210 includes, for example, depositing a metallic layer over the substrate 200 and then heating so that metal and silicide react to form a metal silcide layer. Unreacted metal on the metal silicide layer 210 is removed by wet etching. Aside from the surface of the bottom electrode 204a and the polysilicon gate 204b, the metal silicide layer 210 also covers the source/drain regions of the substrate 200.

A dielectric layer 212 is formed over the metal silicide layer 210 above the bottom electrode 204a. The dielectric layer 212 can be a silicon oxynitride, a silicon nitride or a silicon oxide layer formed by, for example, chemical vapor deposition.

Figure 2D:
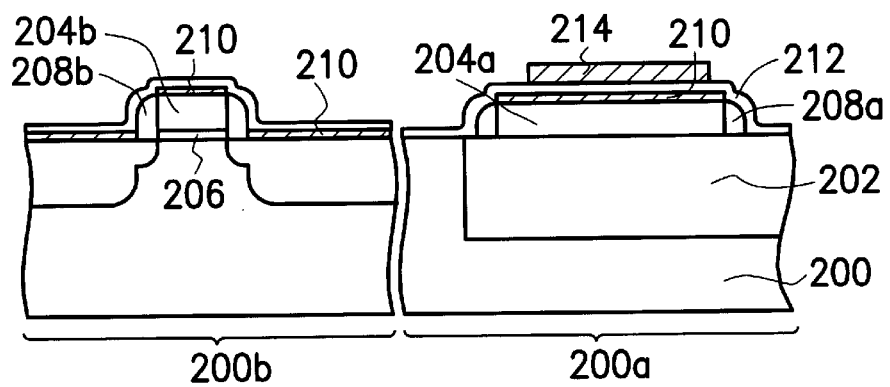

As shown in FIG. 2D, a metallic layer 214 that serves as a top electrode for the capacitor is formed over the dielectric layer 212. The metallic layer 214 can be a tungsten layer or an aluminum layer formed by, for example, sputtering the metal over the substrate 200 followed by patterning using conventional photolithographic and etching processes.

In this invention, the bottom electrode of the capacitor is a metal silicide layer while the top electrode is a metallic layer. Since depletion regions arc unable to form in a metal or the metal silicide electrode and the resistivity of metal or metal silicide electrodes is smaller than a conventional polysilicon electrode, operating speed and frequency of the capacitor can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a capacitor, comprising the steps of:

providing a substrate divided into a memory cell region and a peripheral circuit region, wherein the memory cell region has an isolation structure therein;

forming a gate oxide layer over the substrate in the peripheral circuit region and outside the isolation structure in the memory cell region;

forming a polysilicon layer over the gate oxide layer and the isolation structure;

patterning the polysilicon layer and the gate oxide layer so that a bottom electrode is formed above the isolation structure and a polysilicon gate electrode is formed in the peripheral circuit region;

forming spacers on sidewalls of the polysilicon gate electrode and the bottom electrode;

forming a metal silicide layer over the bottom electrode and the polysilicon gate electrode;

forming a dielectric layer over the metal silicide layer above the bottom electrode; and forming a metallic layer over the dielectric layer, wherein the metallic layer severs as a top electrode.

2. The method of claim 1, wherein the step of forming the metal silicide layer includes depositing tungsten silicide.

3. The method of claim 1, wherein the isolation structure includes a shallow trench isolation structure.

4. The method of claim 1, wherein the step of forming the polysilicon layer further includes doping the polysilicon layer.

5. A method for manufacturing a capacitor, comprising the steps of:

providing a substrate divided into a memory cell region and a peripheral circuit region, wherein the memory cell region has an isolation structure therein;

forming a bottom polysilicon electrode over the isolation structure;

forming a metal silicide layer over the bottom polysilicon electrode;

forming a dielectric layer over the metal silicide layer; and forming a metallic top electrode over the dielectric layer.

6. The method of claim 5, wherein the step of forming the polysilicon layer further includes doping the polysilicon layer.

7. The method of claim 5, wherein the step of forming the bottom polysilicon electrode further includes forming a polysilicon gate electrode in the peripheral circuit region.

8. The method of claim 7, wherein the step of forming the metal silicide layer over the bottom polysilicon electrode further includes forming a metal silicide layer over the polysilicon gate electrode.

9. The method of claim 8, wherein after the step of forming the metal silicide layer, further includes forming spacers on sidewalls of both the polysilicon gate electrode and the bottom electrode.

10. The method of claim 5, wherein the step of forming the metal silicide layer includes depositing tungsten silicide.

11. The method of claim 5, wherein the isolation structure includes a shallow trench isolation structure.

12. A method for manufacturing a capacitor, comprising the steps of:

providing a substrate divided into a memory cell region and a peripheral circuit region, wherein the memory cell region has an isolation structure therein;

forming a gate oxide layer over the substrate in the peripheral circuit region and outside the isolation structure in the memory cell region;

forming a polysilicon layer over the gate oxide layer and the isolation structure;

patterning the polysilicon layer and the gate oxide layer so that a bottom electrode is formed above the isolation structure and a polysilicon gate electrode is formed in the peripheral circuit region;

forming spacers on sidewalls of the polysilicon gate electrode and the bottom electrode;

forming a metal silicide layer over the bottom electrode and the polysilicon gate electrode;

forming a dielectric layer over the metal silicide layer above the bottom electrode; and forming a metallic layer directly on the dielectric layer.

* * * * *